United States Patent [19]
Holdsclaw et al.

[11] Patent Number: 6,141,626
[45] Date of Patent: Oct. 31, 2000

[54] TWO-ELEMENT ENERGY METER HAVING SYSTEMS FOR AUTOMATIC SERVICE TYPE DETECTION

[75] Inventors: Scott T. Holdsclaw; Rodney C. Hemminger, both of Raleigh, N.C.

[73] Assignee: ABB Power T&D Company Inc., Raleigh, N.C.

[21] Appl. No.: 08/853,518

[22] Filed: May 9, 1997

[51] Int. Cl.[7] .................................................. G06F 19/00
[52] U.S. Cl. .............................. 702/60; 702/64; 702/66; 702/61; 324/76.11; 324/76.77; 324/76.83
[58] Field of Search ................................ 702/64, 62, 20, 702/21, 61, 85, 178, 117, 122, 106, 130, 412, 60, 66; 324/137, 107, 116, 74, 141, 115, 127, 76.11, 76.77, 76.83, 510; 700/293

[56] References Cited

U.S. PATENT DOCUMENTS

| | | | |
|---|---|---|---|
| 4,083,000 | 4/1978 | Becker | 324/137 |
| 4,758,962 | 7/1988 | Fernandes | 364/528.28 |
| 4,892,485 | 1/1990 | Patton | 439/167 |
| 5,006,783 | 4/1991 | Corel et al. | 323/263 |
| 5,229,713 | 7/1993 | Bullock et al. | 702/61 |
| 5,321,600 | 6/1994 | Fierheller | 363/65 |
| 5,325,051 | 6/1994 | Germer et al. | 364/528.28 |
| 5,457,621 | 10/1995 | Munday et al. | 363/56 |
| 5,544,089 | 8/1996 | Hemminger et al. | 702/64 |
| 5,548,209 | 8/1996 | Lusignan et al. | 702/62 |
| 5,548,527 | 8/1996 | Hemminger et al. | 702/62 |

OTHER PUBLICATIONS

U.S. application No. 08/752,788, Hubbard et al., filed Nov. 20, 1996.

Miura et al., "Automatic meter reading system by power line carrier communication", IEE Proceedings, vol. 137, issue 1, pp.25–31, ISSN: 0143–7046, Jan. 1990.

Phillips et al., "Transforming the Ferraris disc meter into a key element in an automatic meter reading system", 8th Inter. Conf. on Metering & Tariffs for Energy Supply, No.426, pp.170–174, 1996.

Foord et al., "Remote meter reading, load control and distribution system automation utilizing SWD technology", 6th Inter. Conf. on Metering Apparatus & Tariffs for Electricity Supply, pp. 163–167, 1990.

*Primary Examiner*—James P. Trammell
*Assistant Examiner*—Cuong H. Nguyen
*Attorney, Agent, or Firm*—Woodcock Washburn Kurtz Mackiewicz & Norris LLP

[57] ABSTRACT

A 2-element, three voltage connection electronic energy meter is disclosed for measuring 3-phase electrical energy supplied by a 4-wire delta service without external potential transformers. The meter employs non-isolating voltage sensors for sensing the line voltages and includes and an automatic service type detector and isolation detector. The meter generates voltage and phase angle measurements for each of the two voltages sensed by the meter. The service type detector compares the phase angles to automatically determine the service type supplying the electrical energy to the meter. The isolation detector compares the two voltages to automatically determine whether or not the installation includes external potential transformers. If the service type is a 4-wire delta service and no external potential transformers are used at the installation for isolating the voltage signals, the meter doubles the voltage measured over the first of the two elements when generating power measurements.

19 Claims, 12 Drawing Sheets

THREE-WIRE
THREE-PHASE
DELTA

FOUR-WIRE
THREE-PHASE
DELTA

TWO-ELEMENT ENERGY METER HAVING SYSTEMS FOR AUTOMATIC SERVICE TYPE DETECTION

FIELD OF THE INVENTION

The present invention relates to electronic energy meters, and in particular, to a 2-element, three voltage connection, electronic energy meter having systems for detecting and metering three phase electrical energy supplied by three and four wire delta services.

BACKGROUND OF THE INVENTION

Over the past several decades numerous types of electrical services have emerged as standard services supplied by utilities. As a result of the variation in service type, many forms of energy meters have also been developed to meter electricity supplied by one or more of these standard services. For example, conventional electromechanical 2-element meters have had two separate and isolated voltage sensing circuits. These two isolated sensing circuits have enabled electromechanical meters to be applied to a variety of electrical services.

In recent years, electronic meters have become widely used and have been replacing electromechanical meters in many installations. While conventional potential transformers may be used in an electronic meter to sense the supplied phase voltages, electronic meters may take advantage of more accurate and lower cost resistive dividers for voltage sensing. However, as described in U.S. Pat. No. 5,548,527 dated Aug. 20, 1996 entitled PROGRAMMABLE ELECTRICAL METER UTILIZING A NON-VOLATILE MEMORY and assigned to the same assignee hereunder, resistive dividers share a common voltage reference and therefore the output signals, i.e., the sensed voltage signals, are not isolated.

In some meter installations, potential transformers external to the meter are used. In these installations the lack of isolation from internal voltage sensors is irrelevant because the external potential transformers provide the required isolation. In meter installations where no external potential transformers are used, the line voltages into the meter are not isolated and 2-element electronic meters with resistive divider voltage sensing cannot be used to meter certain standard electrical services.

FIGS 1A and 1B show common distribution circuits for a 3-wire delta service and a 4-wire delta service, respectively. Each phase of the electrical energy supplied by these services is designated in FIGS 1A and 1B as A, B, and C. The 4-wire delta service includes a neutral or common potential point between phases A and B provided by a center tapped secondary of a transformer. As shown in FIG. 1A, the voltage between each phase of a 3-wire delta circuit is 240 V. The phase voltages for a 4-wire delta circuit may also be 240 V between each phase with 120 V between phase A and neutral, 120 V between phase B and neutral, and 208 V between phase C and neutral. It should be understood that the line-to-line voltages supplied by a 4-wire delta service are not limited to 240 V but may include other standard service voltages such as 480 V.

A common measurement technique used in energy meters to measure power involves multiplying the phase voltage sensed by each of the meter's sensing elements by the associated phase currents. Thus for a 2-element meter, power may be computed as follows:

$$\text{Real Power} = \text{Watts} = V_1 I_1 + V_2 I_2 \quad (1)$$

$$\text{Apparent Power} = VA = V_{1RMS} I_{1RMS} + V_{2RMS} I_{2RMS} \quad (2)$$

$$\begin{aligned}\text{Reactive Power} = VARs &= \sqrt{VA_1^2 - \text{Watt}_1^2} + \sqrt{VA_2^2 - \text{Watt}_2^2} \\ &= \sqrt{(V_{1RMS} I_{1RMS})^2 - (V_1 I_1)^2} + \\ &\quad \sqrt{(V_{2RMS} I_{2RMS})^2 - (V_2 I_2)^2}\end{aligned} \quad (3)$$

where $V_1$ represent the voltage associated with the first element, $I_1$ represents the current associated with the first element, $V_2$ represents the voltage associated with the second element, and $I_2$ represents the current associated with the second element. It should be understood that the equation for real power represents the accumulation of the product terms over a predetermined period of time, e.g., two line cycles. Specifically, sampled voltage and current signals are multiplied and then the results accumulated over some known period of time to arrive at the Watts measurements. Thus the simplified notation, for example, $V_1 I_1$ as used herein represents the accumulation of that product term over a certain period of time.

For simplicity, reference to power measurements herein will be described in terms of real power. However, it should be understood that equations for apparent as well as reactive power measurements could be substituted for the equation for real power measurements in the description herein.

FIG. 2A is a circle and blade diagram showing the voltage and current connections to a 2-element meter using an isolated voltage sensing technique. The meter socket 1 shown in FIG. 2A is generally referred to as a Form 5S. Electromechanical meters, for example, use potential transformers for voltage sensing. Since potential transformers provide isolation as discussed above, a 2-element electromechanical meter uses a Form 5S type meter socket as shown in FIG. 2A. Accordingly a meter socket 1 has inputs corresponding to $V_1$, $I_1$, $V_2$, and $I_2$ as depicted in FIG. 2A.

FIG. 2B is a circle and blade diagram showing the voltage and current connections to a 2-element meter in which a non-isolating voltage sensing techniques are used. The meter socket shown in FIG. 2B is referred to as a Form 35S. For example, as discussed above, solid state meters often employ resistive division for voltage sensing. Accordingly, a meter socket 2 has inputs and outputs corresponding to $V_1$, $I_1$, $V_2$, and $I_2$ as shown in FIG. 2B. Note that meters with non-isolating voltage sensors have their voltage inputs tied together at a common potential 3.

FIG. 3 shows a meter vector diagram for a 3-wire delta service. The phase voltages and currents for phases A, B, and C as shown in FIG. 1A are shown relationally in FIG. 3 mapped to $V_1$, $I_1$, $V_2$, and $I_2$. FIGS. 4A and 4B show a 2-element meter connected to a 3-wire delta service with external potential transformers and without external potential transformers, respectively. Either type of meter socket 1,2 may be used in connection with a 3-wire delta service. Current transformers 14, 16 are coupled to the meter socket inputs 4, 8, 6, 9 as shown. In FIG. 4A, potential transformers 18, 20 are coupled to the meter socket inputs 22, 24, 10, 12 as shown. The voltage inputs 10,12 are tied together with an external jumper 5. In FIG. 4B, no potential transformers are used external to the meter and therefore, the phase potential from phase A is coupled directly to the meter voltage input 22 for $V_1$; the phase potential for phase B is coupled directly to the meter voltage input 12 for $V_2$; and the phase potential for phase C is coupled directly to the meter voltage input 24 for $V_2$.

It can be seen by comparing FIG. 3 with FIGS. 4A and 4B, that $V_1 = V_A - V_B$ $I_2 = I_A$ $V_2 = V_C - V_B$ $I_2 = I_C$.

Thus, regardless of whether or not external potential transformers are used and regardless of whether or not isolating or non-isolating voltage sensors are used within the meter, i.e., whether a Form 5 or Form 35S is used, the power calculations for a 2-element meter connected to a 3-wire delta service are the same. Consequently, the meter calculations as set forth in equations (1), (2) and (3) above are rather straightforward when connected to a 3-wire delta service.

It is particularly advantageous to use a 2-element meter having resistive dividers with current limiting features as disclosed in U.S. Pat. No. 5,548,527 referred to above in a 3-wire delta installation. Such current limiting features prevent the meter's electronics from operating at elevated levels associated with the service voltage.

It should be noted that the Form 5S meter socket effectively has three voltage inputs or connections when jumper 5 is used to tie together the voltage connections. However, when jumper 5 is not use, the Form 5s has four voltage inputs or connections. The Form 35S effectively has three voltage connections or inputs because the resistors are tied together at common potential point 3 (see FIG. 2B).

FIG. 5 shows a meter vector diagram of a 4-wire delta service. The relationships between the phase voltages and currents for phases A, B, and C from FIG. 1B are shown specifically mapped to measurement voltages $V_1$ and $V_2$ and measurement currents $I_1$ and $I_2$. FIG. 6 shows a 2-element meter connected to the 4-wire delta service using external potential transformers. As can be seen from FIGS. 5 and 6, the measured parameters remain the same regardless of whether the voltage sensing employed by the meter is isolated or non-isolated, i.e., Form 5S or Form 35S. Because both negative voltage inputs are tied together by jumper 5, the voltage between $V_1$ in and $V_1$ out is isolated by external transformer 18 so that a measurement corresponding to $V_1$ is possible with a Form 35S. The measurement voltages and currents can be defined from FIGS. 5 and 6 thus found as follows:

$V_1 = V_A - V_B$ $I_1 = I_A - I_B$ $V_2 = VC - V_N$ $I_2 = 2I_C$

The line corresponding to phase C is looped through transformer 14 two times so that the measured line current, $I_2$, is similar in magnitude to the current measured for $I_1$ which includes the sum of $I_A$ and $I_B$ as shown in FIG. 6.

FIG. 7 shows a 2-element meter with isolating voltage sensors connected to a 4-wire delta service without external potential transformers. The measurement voltages and currents are:

$V_1 = V_A - V_B$ $I_1 = I_A - I_B$ $V_2 = V_C - V_N$ $I_2 = 2I_C$

Note that the measurement voltages and currents do not change for a Form 5S when connected to the phase lines with or without external potential transformers.

However, when resistive dividers or other non-isolating voltage sensors are used by the meter, the measurement voltages and currents differ. FIG. 8 shows a 2-element meter with non-isolating voltage sensors connected to a 4-wire delta service without external potential transformers. The meter vector diagram resulting from this connection is shown in FIG. 9. As can be seen from FIGS. 8 and 9, the measurement voltages and currents are:

$V_1 = V_A - V_N$ $I_1 = I_A - I_B$ $V_2 = V_C - V_N$ $I_2 = 2I_C$

Since $V_1$ does not represent the voltage measured between phases A and B, equations (1), (2), and (3) above are not valid for a 4-wire delta service without external potential transformers where the voltage signals from the sensing circuits are not isolated.

As discussed above, resistive dividers are an example of sensing circuits which do not provide isolated output signals because the resistive divider associated with each phase require a common reference potential. Therefore, a 2-element meter having resistive dividers with current limiting as disclosed in U.S. Pat. No. 5,548,527 cannot be used to meter energy supplied by a 4-wire delta service without external potential transformers. Consequently, there exists a need for a 2-element meter with non-isolating voltage sensing circuits, i.e., a Form 35S meter, that is capable of metering energy supplied by a 4-wire delta service.

Moreover, as discussed in co-pending application U.S. Provisional Application No. 60/028,986 filed Oct. 22, 1996 entitled ELECTRONIC ENERGY METER assigned to the same assignee hereunder, there is a general trend to provide versatile electronic energy meters that are capable of metering electrical energy supplied from a variety of services. One advantage of such meters is a reduction of inventory of different meters by utilities. However, use of such meters often require specialized knowledge and training for proper installation. Therefore, there is also a need for a versatile 2-element meter that can be simply installed at installations supplied by a 3-wire delta or a 4-wire delta service, irrespective of whether or not external potential transformers are used.

SUMMARY OF THE INVENTION

The present invention fulfills this need by providing an electronic meter for metering three-phase electrical energy including a service detector for determining whether the meter is connected to a 3-wire delta service or a 4-wire delta service, an isolation detector for determining whether or not the line voltages so sensed are isolated; and a power measurement generator operatively interfaced with the service detector and the isolation detector for generating power measurements based on the determinations made by the service detector and the isolation detector. The meter according to the invention also includes a phase angle measurement generator interfaced with the service detector for measuring the phase angle between two phases of the electrical energy.

In a preferred embodiment, the meter is a 2-element meter and the isolation detector includes a voltage comparator for comparing the phase voltage measured over each of the two elements. Based upon which of the two phase voltages is largest, the meter preferably determines whether the line voltages are isolated.

In a further preferred embodiment, the determinations made by the service detector and the isolation detector are made programmably at a preselected set of times or prior to each power measurement. The meter preferably includes an enable means for programmably enabling the service detector and the isolation detector.

The present invention also fulfills the aforementioned needs by providing a 2-element electronic energy meter for metering three-phase electrical energy designated as phase A, phase B, and phase C, where the meter has three voltage connections defined as $V_1$ which serves as a voltage input for phase A or phase B, $V_2$ which serves as a voltage input for phase C, and $V_N$ which corresponds to a neutral potential point among all three phases of the electrical energy. The meter according to this aspect of the present invention includes a first voltage sensing means for sensing the voltage $V_1$, referenced to $V_N$ a second voltage sensing means for sensing the voltage $V_2$ referenced to $V_N$, and a voltage doubling means for doubling the voltage $V_1$ referenced to $V_N$. In a preferred embodiment, the first voltage sensing means and second voltage sensing means are resistive dividers. The electrical energy is supplied to the meter by a 4-wire delta service without external potential transformers.

The present invention also provides a method of metering three phase electrical energy using a 2-element electronic energy meter with three voltage connections including steps for receiving an input of voltage signals relating to the three-phase electrical energy supplied to the meter, processing the voltage signals to determine the voltage for a first voltage measurement ($V_1$) of the electrical energy referenced to a common potential point among the three phases ($V_N$), the voltage for a second voltage measurement ($V_2$) of the electrical energy referenced to $V_N$, and the phase angle between $V_1$ and $V_2$, comparing the phase angle between $V_1$ and $V_2$ to identify the service type as a 3-wire delta service or a 4-wire delta service, comparing the voltages for $V_1$ and $V_2$ to determine whether or not the voltage signals are isolated, and generating a power measurement based on the service type and voltage isolation determinations. The service type is preferably identified as a 4-wire delta service when the phase angle between $V_1$ and $V_2$ is either of about 90 degrees or about 270 degrees. The voltage signals are preferably determined to be isolated when the voltage $V_1$ is greater than voltage $V_2$.

In a preferred embodiment, the power measurement is generated in accordance with the following:

$$kV_1I_1+V_2I_2$$

where $I_1$ and $I_2$ are currents associated with respective first and second measurements of the electrical energy supplied to the meter and where k=1 for a 3-wire delta service and for a 4-wire delta service with isolated voltage signals and where k=2 for a 4-wire delta service with non-isolated voltage signals.

The present invention further provides a 2-element electronic energy meter for metering three-phase electrical energy having three voltage connections including voltage sensors for sensing at least two voltages associated with the electrical energy supplied to the meter and generating an output of voltage signals, current sensors for sensing at least two currents associated with the electrical energy supplied to the meter and generating an output of current signals, a sampling means coupled to the voltage sensors and current sensors for sampling the voltage signals and the current signals to provide an output of sampled voltage signals and sampled current signals respectively, a non-volatile memory having stored therein service type identification information specifying either a preselected service type or automatic service type detection; and a digital signal processor interfaced with the non-volatile memory to receive the service type identification information and coupled to the sampling means for generating power measurements depending upon the service type identification information. In a preferred embodiment, the digital signal processor automatically detects whether the service type is a 3-wire delta service or a 4-wire delta service when the service type identification information specifies automatic service type detection. More preferably, the digital signal processor additionally detects whether or not the sensed voltages are isolated when the service type identification information specifies automatic service type detection and the service detected is the 4-wire delta service. Still further, the digital signal processor preferably automatically detects whether the service type is a 3-wire delta service, a 4-wire delta service with external potential transformers, or a 4-wire delta service without external potential transformers when the service type identification information specifies automatic service type identification.

The present invention provides yet another method for measuring electrical energy in a 2-element electronic energy meter connected to a 4-wire delta installation. This method includes steps for measuring the voltage between phase A ($V_A$) and a common potential point $V_N$ and defining the measurement as $V_1$, measuring the voltage between phase C ($V_C$) and $V_N$ and defining the measurement as $V_2$; and doubling $V_1$, if $V_1$ is less than $V_2$. Preferably the meter uses non-isolated voltage sensors for sensing the voltage of the electrical energy being metered at the 4-wire delta installation.

BRIEF DESCRIPTION OF THE DRAWINGS

The present invention will be better understood, and its numerous objects and advantages will become apparent by reference to the following detailed description of the invention when taken in conjunction with the following drawings, in which.

DETAILED DESCRIPTION OF THE INVENTION

According to the present invention, a 2-element electronic meter having a Form 35S meter socket can be utilized to meter energy supplied by a 4-wire delta service without external potential transformers. Moreover, the present invention does not require hardware, software, or firmware modifications to meter 3 or 4 wire delta services regardless of the voltage sensing technique used. The electronic meter in accordance with the present invention preferably automatically detects not only the service type used to supply the electrical energy, but also automatically determines whether or not external potential transformers are used.

Figure 1A:
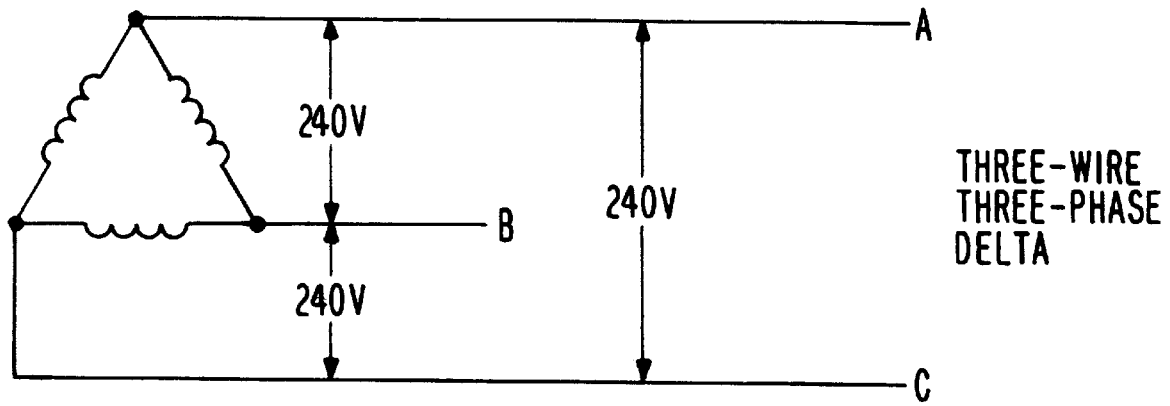
FIGS 1A and 1B show common distribution circuits for a 3-wire delta service and a 4-wire delta service, respectively
Figure 1B:
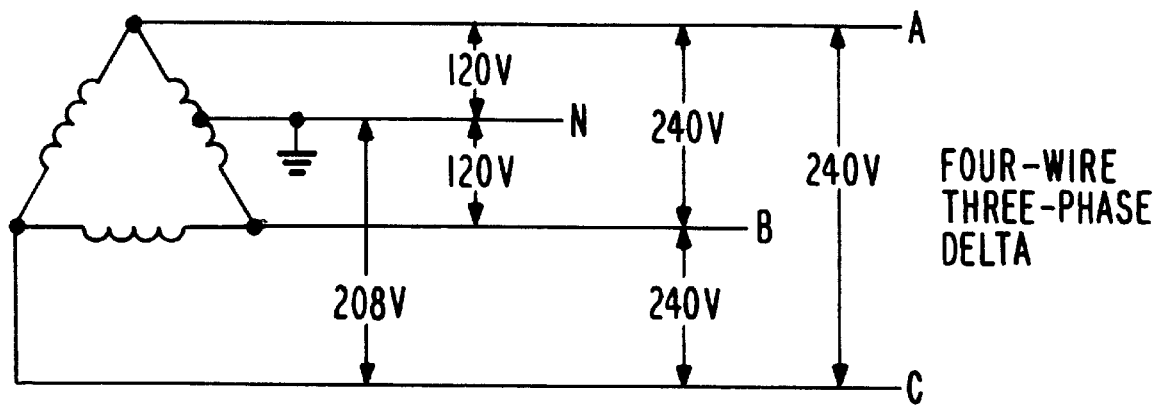
Figure 2A:
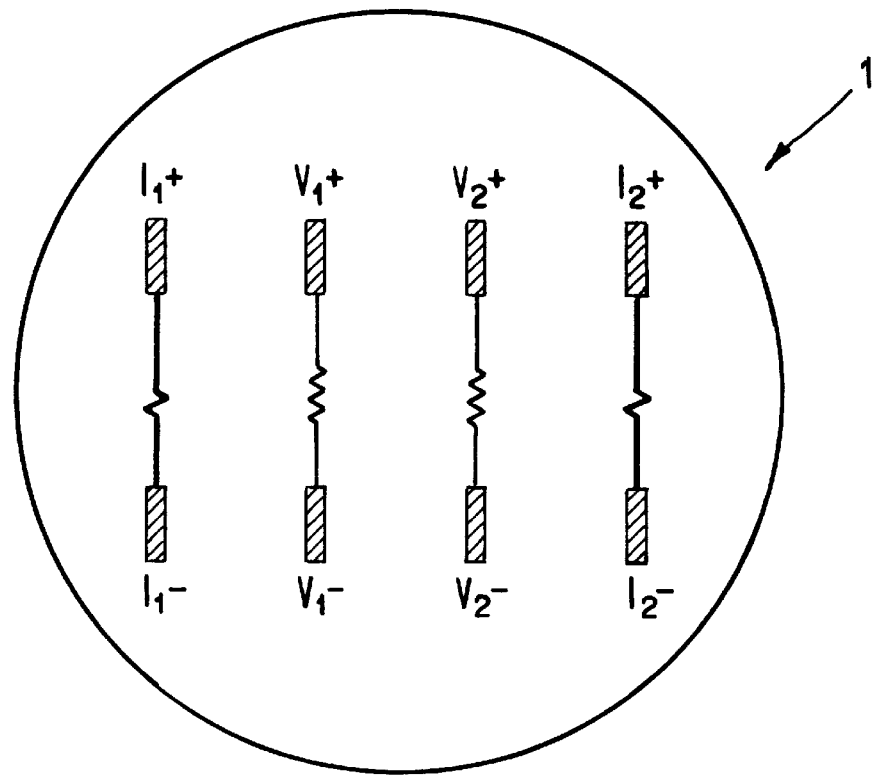
FIG. 2A shows a circle and blade diagram of a Form 5S meter socket.
Figure 2B:
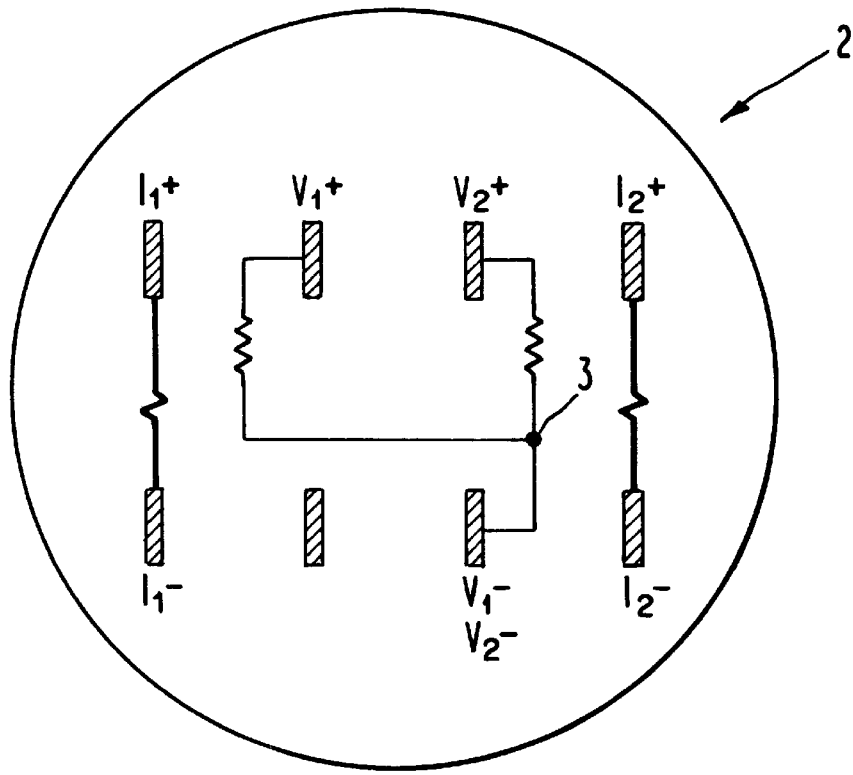
FIG. 2B shows a circle and blade diagram of a Form 35S meter socket.

Referring back to FIG. 1B it can be seen that the 4-wire delta service is presumed balanced in that the voltage between phase A and neutral is the same as the voltage between phase B and neutral, i.e., 120V. The present invention takes advantage of this presumption. Assuming that the circuit is balanced, the voltage between phase A and neutral and between phase B and neutral are equivalent such that:

$$V_A - V_B = 2(V_A - V_N). \quad (4)$$

Figure 9:
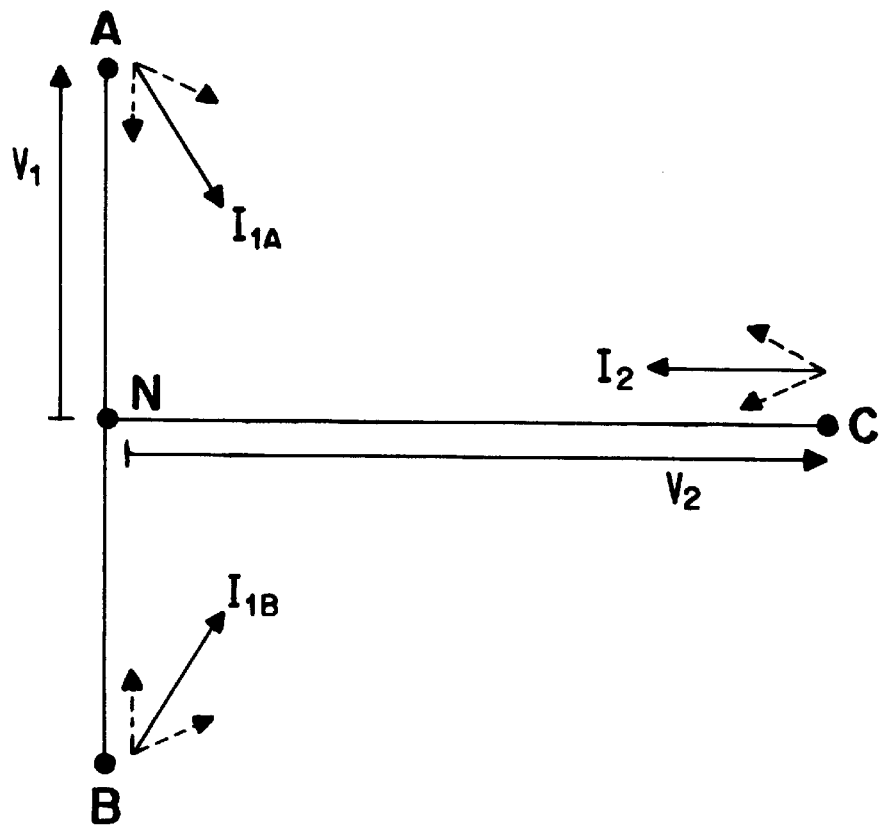
FIG. 9 shows a meter vector diagram for a 2-element meter connected to a 4-wire delta service as shown in FIG. 8.
Figure 6:
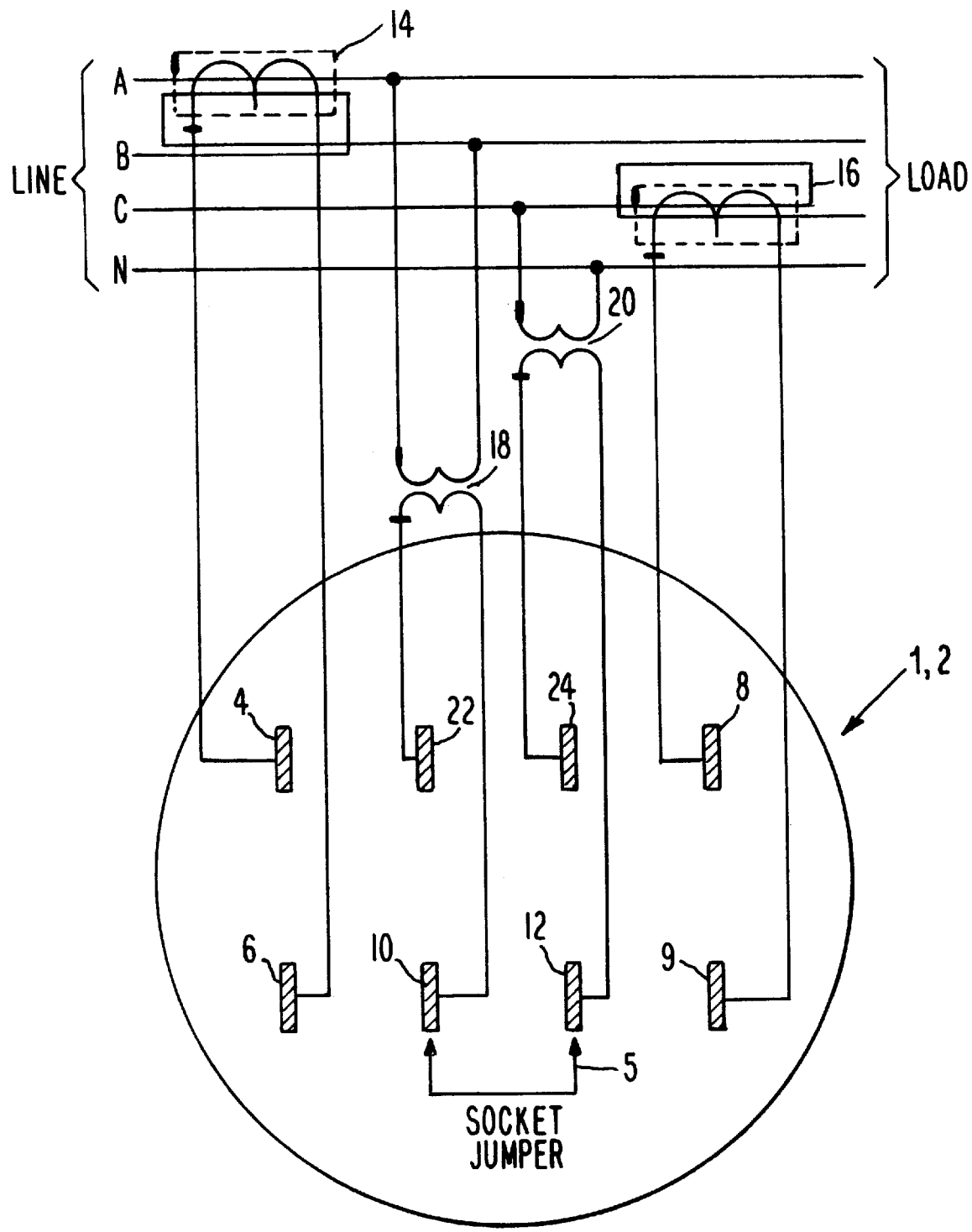
FIG. 6 shows a 2-element meter connected to a 4-wire delta service using external potential transformers.

Power may then be measured using a form 35S meter connected with a 4-wire delta service as shown in FIGS. 9 in accordance with the following equation:

$$2(V_A - V_N)(I_A - I_B) + (V_C - V_N)(I_C) \quad (5)$$

Substituting $V_1$, $I_1$, $V_2$ and $I_2$ as defined above in connection with FIG. 9, the equation then becomes, $$2V_1 I_1 + V_2 I_2 \quad (6)$$

which is equation (1) above except for the factor of 2 associated with the first product term. Thus equations (1) and (6) may be rewritten in common form as follows:

$$k V_1 I_1 + V_2 I_2 \quad (7)$$

where k is equal to 1 when metering energy supplied by a 3-wire delta service or for a 4-wire delta service with external potential transformers and where k is 2 when metering energy supplied by a 4-wire delta service without external potential transformers.

Similarly it should be understood that equations (4) and (5) may be rewritten respectively as:

$$\text{Apparant Power} = VA = k V_{1RMS} I_{1RMS} + V_{2RMS} I_{2RMS} \quad (8)$$

$$\text{Reactive Power} = VARs = \sqrt{VA_1^2 - Watt_1^2} + \quad (9)$$
$$\sqrt{VA_2^2 - Watt_2^2}$$
$$= \sqrt{(kV_{1RMS} I_{1RMS})^2 - (kV_1 I_1)^2} +$$
$$\sqrt{V_{2RMS}^2 I_{2RMS}^2 - (V_2 I_2)^2}$$

Figure 10:
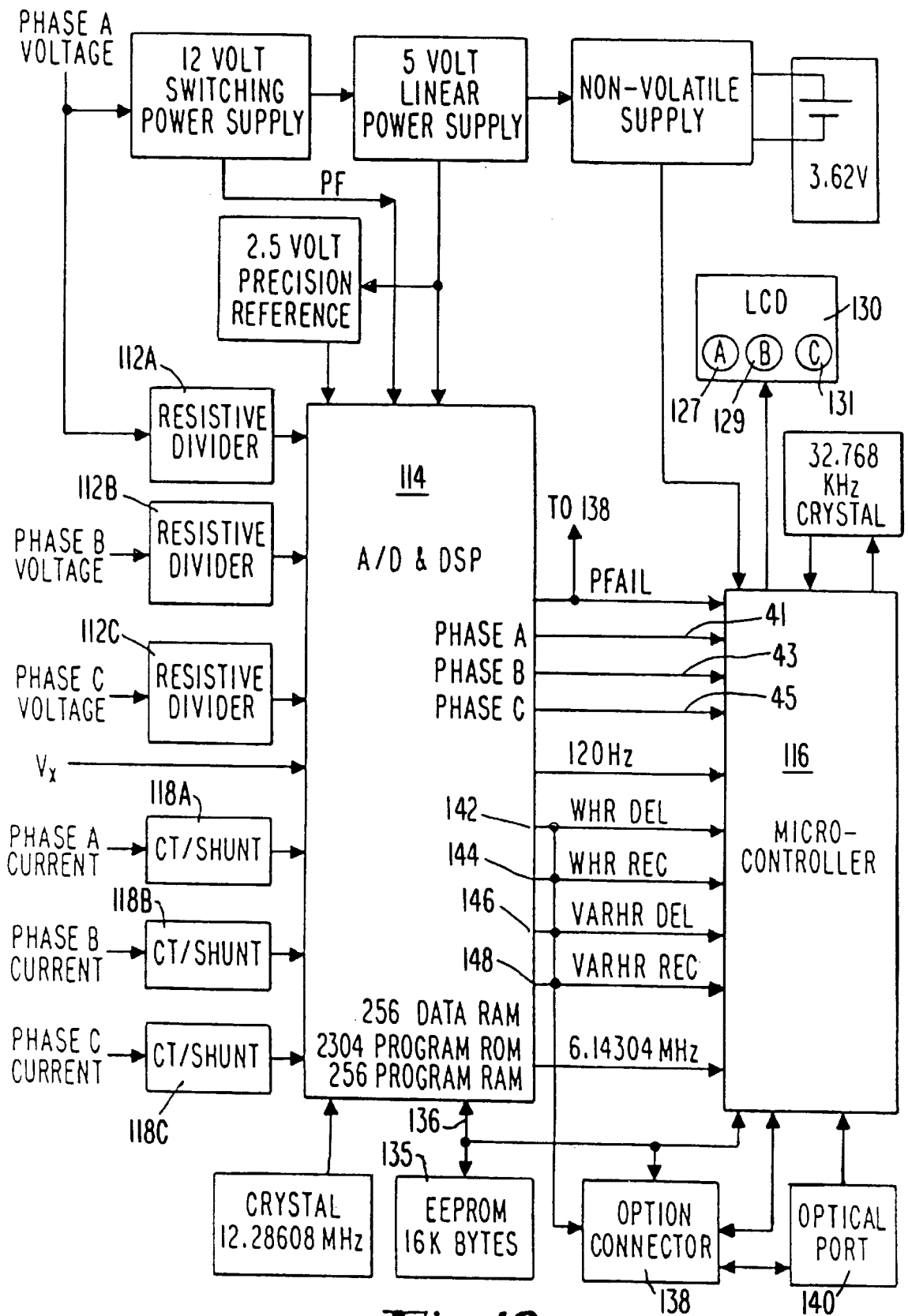
FIG. 10 shows a functional block diagram of an electronic meter capable of implementing the present invention in a preferred embodiment.

The meter according to the present invention implements equation (7) to generate power measurements using parameters and programming stored in a non-volatile memory which are downloaded to a programmable digital signal processor after the meter is powered up. FIG. 10 shows a functional block diagram of an electronic meter capable of implementing the present invention in a preferred embodiment. As shown in FIG. 10, the meter for metering three-phase electrical energy preferably includes a digital LCD type display 130, an integrated circuit (meter IC) 114 which preferably comprises A/D converters and a programmable DSP, and a microcontroller 116. It should be understood that a meter having a single microprocessor or microcontroller may be used to implement the present invention. Similarly, if a DSP is used in addition to a microcontroller as shown in FIG. 10, it is not essential that the DSP be programmable, since the functions performed by the present invention may be carried out bu the microcontroller.

Analog voltage and current signals propagating over power transmission lines between the power generator of the electrical service provider and the load are sensed by voltage sensors 112A, 112B, 112C and current transformers 118A, 118B, 118C, respectively. The outputs of the voltage sensors and current transformers, or sensed voltage and current signals, are provided as inputs to the meter IC. The A/D converters in the meter IC convert the sensed voltage and current signals into digital representation of the analog voltage and current signals. In a preferred embodiment the A/D conversion is carried out as described in U.S. Pat. No. 5,544,089 dated Aug. 6, 1996 entitled PROGRAMMABLE ELECTRICAL METER USING MULTIPLEXED ANALOG-TO-DIGITAL CONVERTERS, assigned to the same assignee of the present invention. The sampled voltage and current signals are then input to the programmable DSP in the meter IC for generating pulsed signals 142, 144, 146, 148 representing various power measurements, i.e., each pulse represents the Ke value associated with watts, Volt Amperes (VA) or Volt Amperes Reactive (VAR). These pulsed signals may be processed by the microcontroller 116 to perform revenue metering functions for billing purposes, instrumentation functions for diagnostics, or testing functions. The pulsed signals may also be provided to the display 130 or provided via bus 136 described below as an output to the optical port 140 or to the option connector 138 for RF or electronic communication.

While the microcontroller preferably performs numerous revenue metering functions, it also performs instrumentation functions. Instrumentation functions, in contrast to revenue functions, are intended to assist a technician in evaluating a service based on near-instantaneous conditions at the meter.

The meter IC 114 and microcontroller 116 each preferably interface with one or more memory devices through the intelligent interface and control (IIC) bus 136. An EEPROM 135 is provided to store revenue data as well as programs and program data. Upon power up after installation or a power failure, or a data altering communication, for example, selected programs and program data stored in the EEPROM may be downloaded to the Program RAM and Data RAM associated with the meter IC 114 as shown in FIG. 10. The DSP under the control of the microcontroller processes the sampled voltage and current signals in accordance with the downloaded programs and data stored in the respective Program RAM and Data RAM.

To perform revenue, instrumentation or testing functions the microcontroller may require both voltage and current measurement information from the DSP. According to a preferred embodiment of the present invention the meter IC monitors the digital phase voltage signals and phase current signals over two line cycles (at about 50 or 60 Hz, two line cycle measurements are defined herein as RMS measurements even though they are "near-instantaneous") and then computes the RMS values for revenue, instrumentation or testing purposes. In a preferred embodiment the RMS measurements are generated in accordance with the following formula using voltage or current samples represented as $S_x$:

$$S_x rms = \sqrt{\frac{\sum_{i=1}^{i=N} S_x i^2}{N}} \quad (10)$$

where N equals the number of samples per a selected number of line cycle intervals and x equals 1 or 2 referring to respective first and second voltages or currents. It should be understood that the number of line cycles is preferably programmable and a different number of line-cycles may be used for designated measurements. The RMS parameters computed for each phase, A, B, and/or C, are then stored in a register in data RAM. The microcontroller polls for data in these registers via the IIC bus.

The DSP in the meter IC 114 also drives potential indicators 127, 129 and 131 which are preferably designated sections on the LCD 130. Phase potential for each phase is present so long as the corresponding potential indicator remains lit. Phase A, B, and C potential signals 41, 43, 45 are output from the meter IC to the microcontroller which in turn drives the potential indicator 127, 129, 131 so that the potential indicator remains lit when the potential signals are high.

Figure 11:
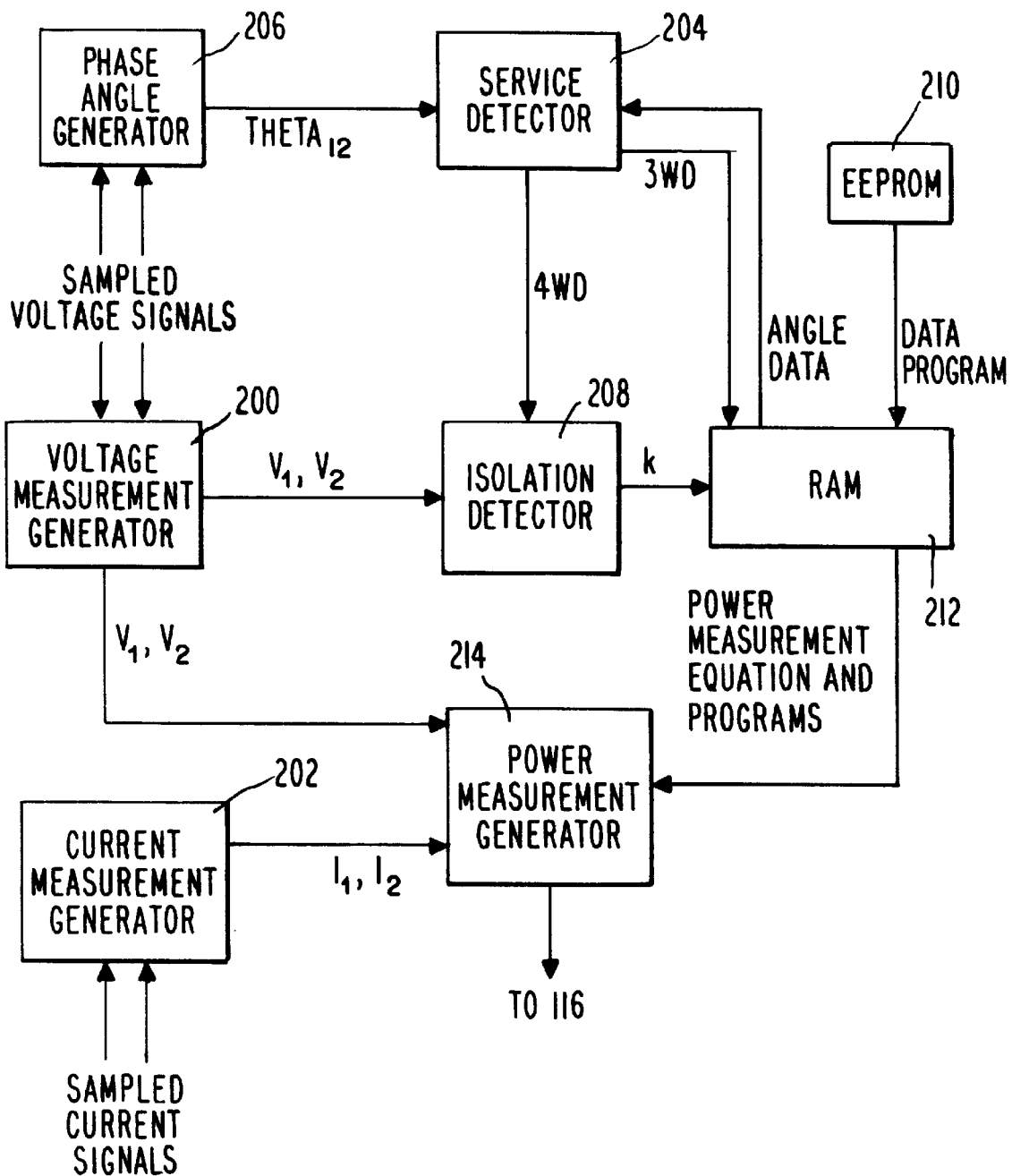
FIG. 11 shows a functional block diagram of the automatic service and isolation detection system in accordance with a preferred embodiment of the present invention.

FIG. 11 shows a functional block diagram of the automatic service and isolation detection system in accordance with a preferred embodiment of the present invention. The EEPROM 210 represents a portion of EEPROM 135 in FIG. 10 and includes data stored therein indicating that the meter is a 2-element meter with a Form 35S meter socket and that the meter is to apply equation (7) above to generate power measurements. The EEPROM 210 also preferably contains data to be used by the DSP in determining what service type is supplying electrical energy to the meter. This data may be programmed into the meter during manufacture or thereafter using the option connector interface. Programs used by the DSP in determining whether the installation includes external potential transformers are also stored in the EEPROM.

Upon power up after installation or following a power failure or a data altering communication, the data and related programs are downloaded from the EEPROM 210. The sampled voltage signals output from the A/D converters are provided as inputs to voltage measurement generator 200 which computes $V_1$ and $V_2$ preferably in accordance with equation (10) above over a preselected period of time. As discussed above, it is preferable to measure the near-instantaneous voltage over two line cycles. In a similar fashion, the sampled current signals are output from the A/D converters to a current measurement generator 202 in the DSP. The current measurement generator generates $I_1$ and $I_2$ using equation (10) for the current samples. The samples are preferably accumulated for the same 2-line cycle interval that the voltage samples are accumulated.

The sampled voltage signals are also input to a phase angle generator 206 in the DSP. The phase angle generator uses the voltage samples to determine the voltage phase angle for $V_1$, $\phi_1$, and for $V_2$, $\phi_2$, or more preferably the phase angle between $V_1$ and $V_2$, $\phi_{12}$. It should be understood that techniques are known for determining the phase angles using the sampled voltage signals. For instance, the samples can be applied to a Discrete Fourier Transform (DFT) such that the outputs of the DFT can be used to obtain both the magnitude and angle of the voltage phasors.

In a preferred embodiment, the sensed voltage signals input to the A/D converters are sampled at about 2400 Hz. If the line frequency is 60 Hz, then there are approximately 40 samples per cycle input to the phase angle generator. Also in a preferred embodiment of the invention, the phase angle generator generates $\phi_{AC}$. The phase angle generator preferably detects a positive going zero-crossing for the samples associated with phase A and counts out the number of samples until a positive going zero-crossing is detected with respect to the phase C samples. The number of samples between the phase A and the phase C zero-crossing of the 40 samples per cycle is proportional to the phase angle between phases A and C. In a more preferred embodiment, the phase angle that is derived by the phase angle generator is rounded to the nearest 30 degree increment. The computations are preferably carried out by reference to a phase angle data table stored in the EEPROM and downloaded to RAM.

Figure 3:
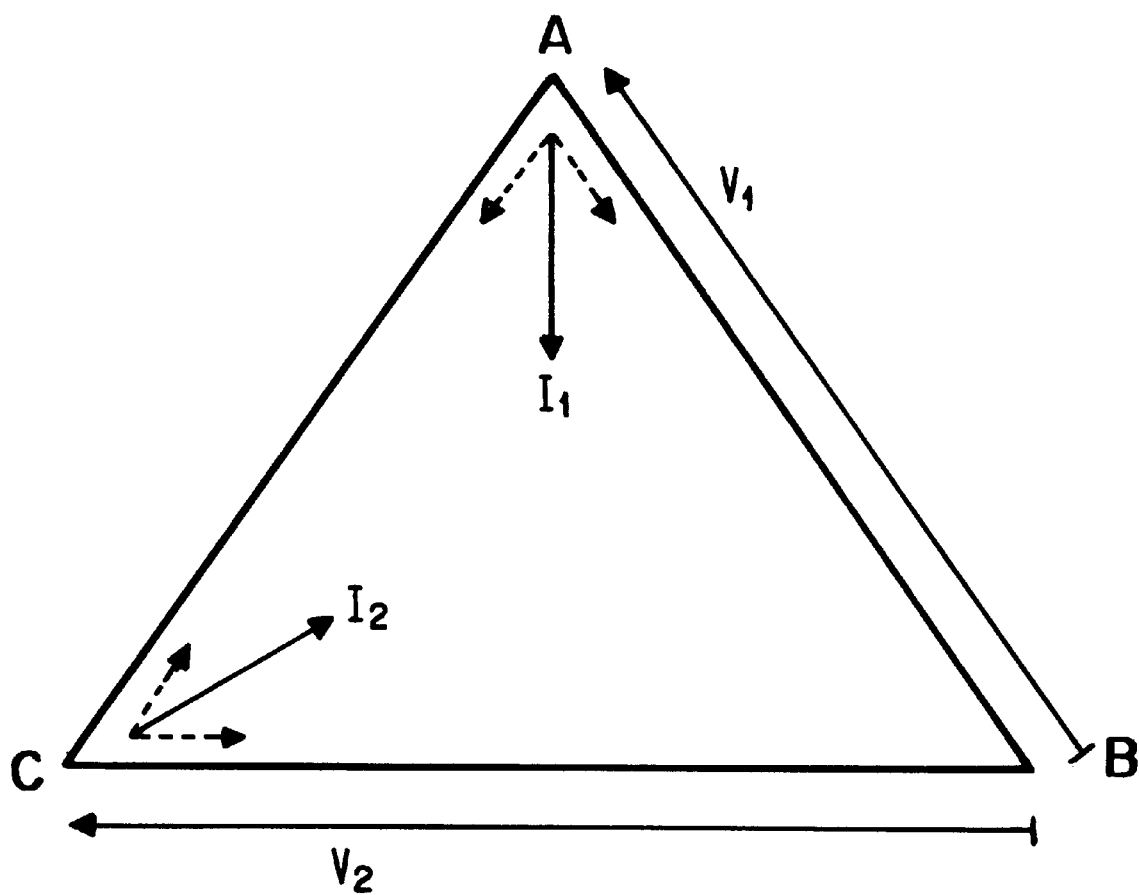
FIG. 3 shows a meter vector diagram for a 3-wire delta service.
Figure 4A:
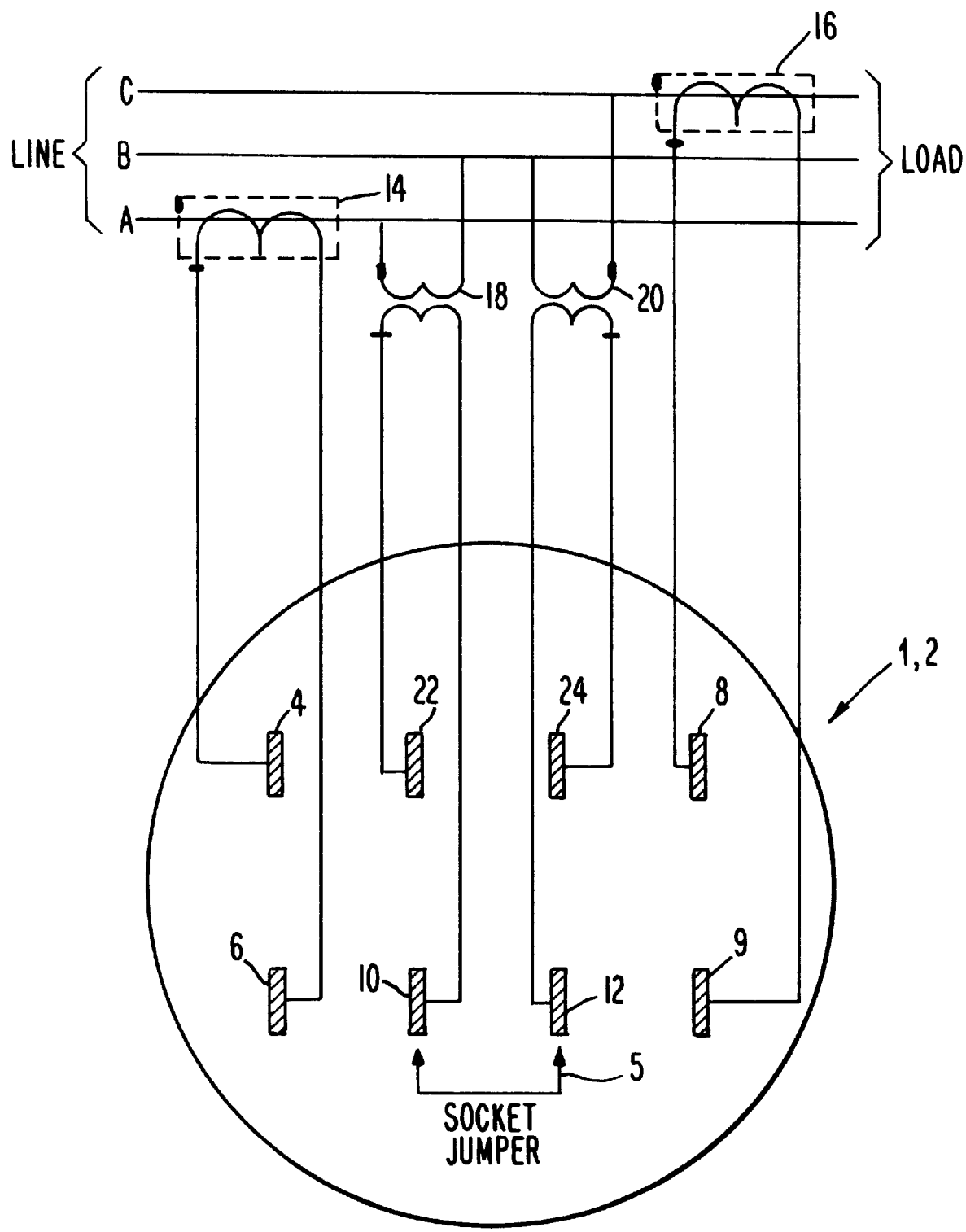
FIGS. 4A and 4B show a 2-element meter connected to a 3-wire delta service with external potential transformers and without external potential transformers, respectively.
Figure 4B:
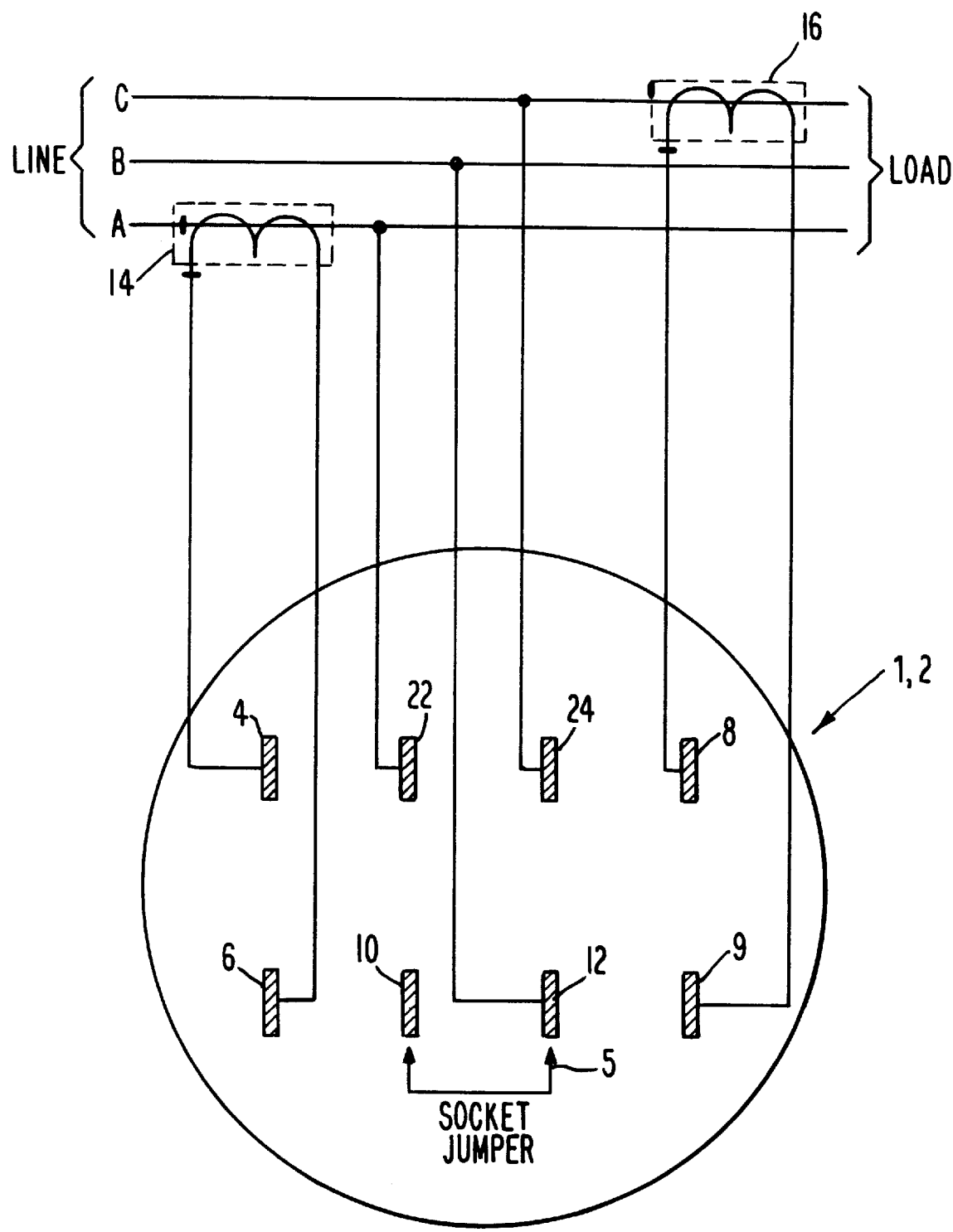
Figure 5:
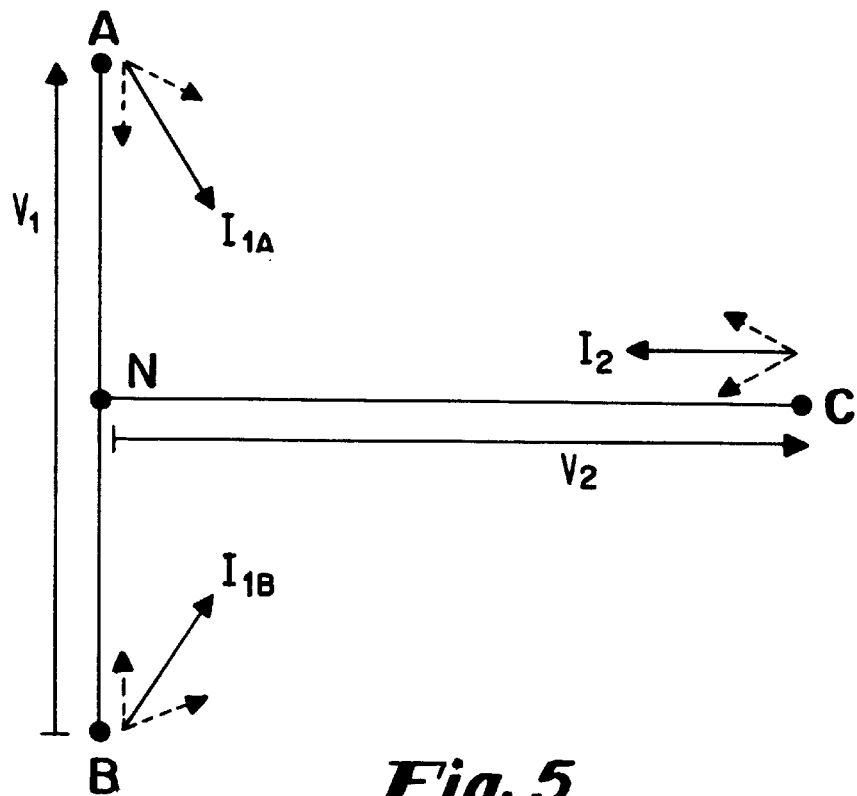
FIG. 5 shows a meter vector diagram of a 4-wire delta service.
Figure 7:
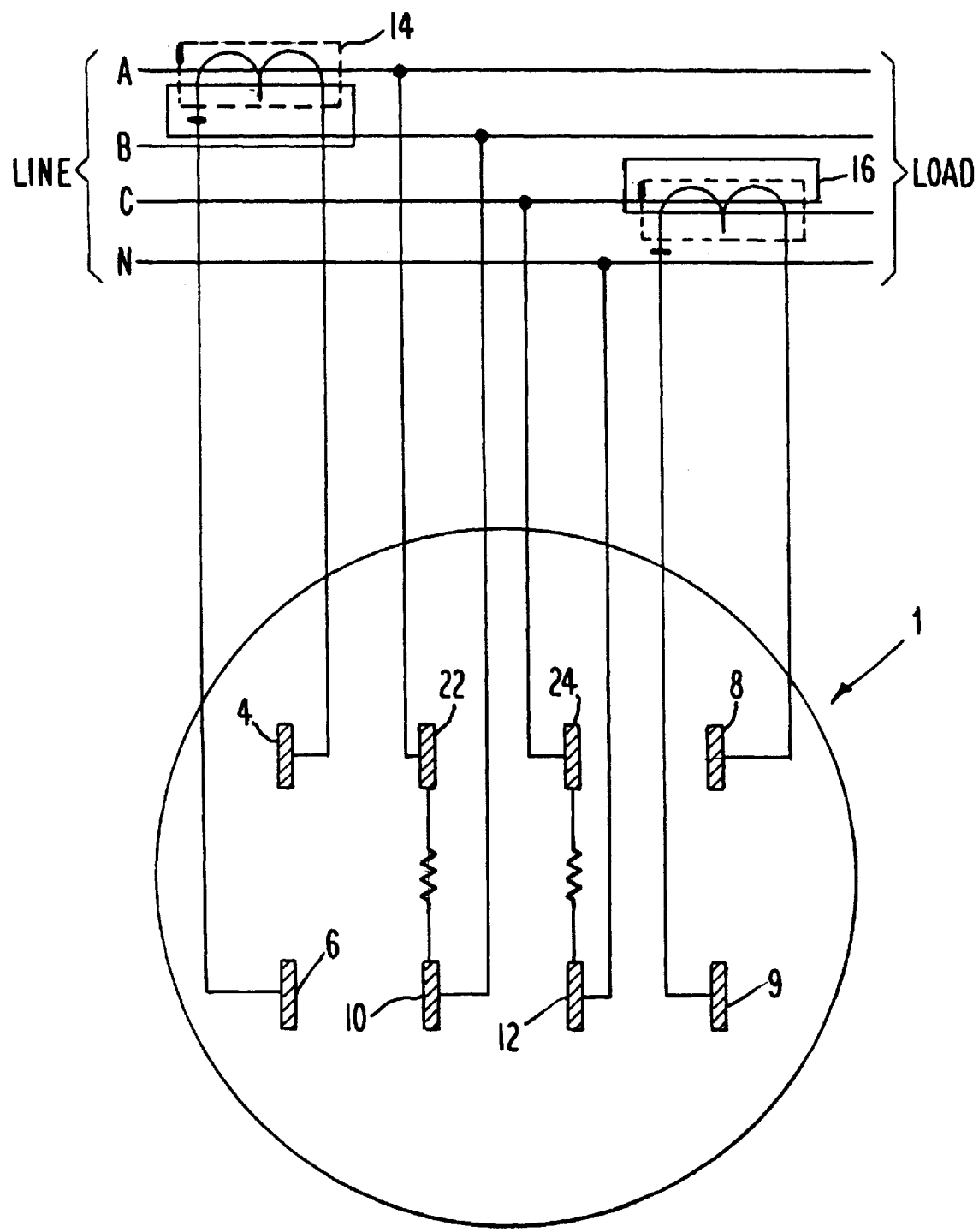
FIG. 7 shows a 2-element meter with isolating voltage sensors connected to a 4-wire delta service without external potential transformers.
Figure 8:
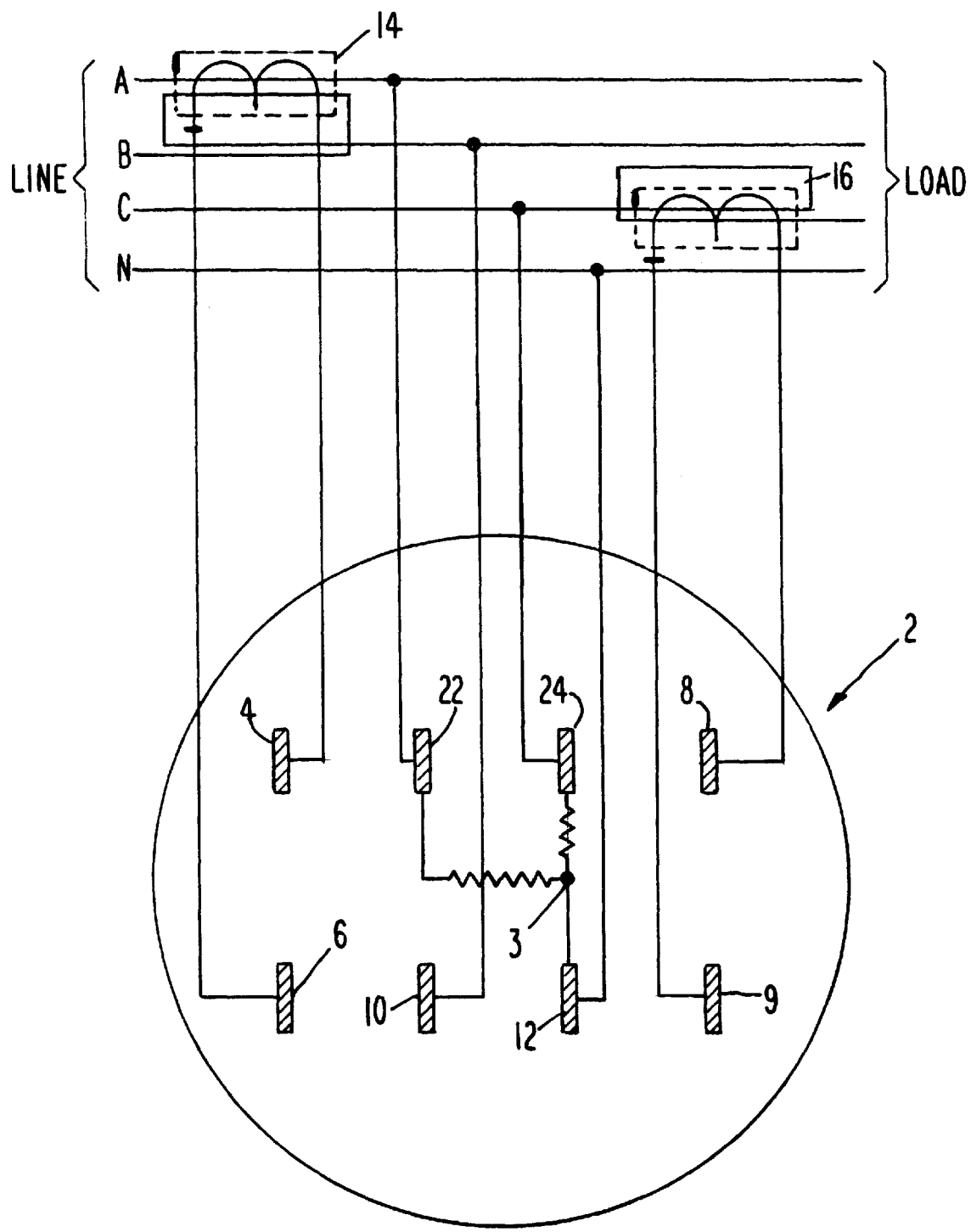
FIG. 8 shows a 2-element meter with non-isolating voltage sensors connected to a 4-wire delta service without external potential transformers.

Because the phase angles associated with a 3-wire delta service and a 4-wire delta service are substantially different, the phase angle data generated by the phase angle generator 206 can be used to detect the service type supplying the electrical energy. Specifically, it is known that the voltage phase angle between phase A and phase C is 90 degrees for a 4-wire delta service (see FIGS. 5 and 7). The voltage angle between phase A and phase C for a 3-wire delta service is 60 degrees (see FIG. 3). Thus depending on the phase rotation, $\phi_{AC}$ for a 4-wire delta is approximately 90 degrees or 270 degrees, and 60 degrees or 300 degrees for a 3-wire delta. The phase angles output from the phase angle generator are input to the service detector 204 which utilizes these phase angle relationships to identify the correct service.

As discussed above, $V_2$, i.e., $V_C$-$V_N$, is 208 V for a 4-wire delta service and $V_1$, i.e., $V_A$-$V_B$, is about 240 V when external potential transformers are used at the installation. However, at an installation without external potential transformers, $V_1$, i.e., $V_A$-$V_N$, is approximately 120 V. Thus the isolation detector 208 utilizes this information to determine whether or not the phase voltages are isolated. In a preferred embodiment, $V_1$ and $V_2$ are input to isolation detector 208 which compares $V_1$ and $Y_2$ to determine which one is greater. If $V_2$ is greater than $V_1$, then it is assumed that no external potential transformers are used at the installation.

If the service detector determines that the service is a 3-wire delta service, k=1 in equation (7), and there is no need to determine whether or not isolated phase voltages are present. Therefore, the power measurement generator 214 accepts the voltage and current measurements from the voltage measurement generator 200 and current measurement generator 202, respectively. The power measurement generator then processes $V_1$, $V_2$, $I_1$ and $I_2$ in accordance with equations (1), (2) and (3) and outputs one or more power measurements to the microcontroller 116.

If the service detector determines that the service is a 4-wire delta service, then k must be determined by the isolation detector. If the isolation detector determines that the phase voltages are isolated, then the power measurements are generated as discussed in connection with the 3-wire delta service. If the isolation detector determines that phase voltages are not isolated, i.e.,that external potential transformers are present, then k is set equal to 2. The power measurement generator then processes $V_1$, $V_2$, $I_1$ and $I_2$ in accordance with equations (7), (8), or (9) and outputs one or more power measurements to the microcontroller 116.

Figure 12:
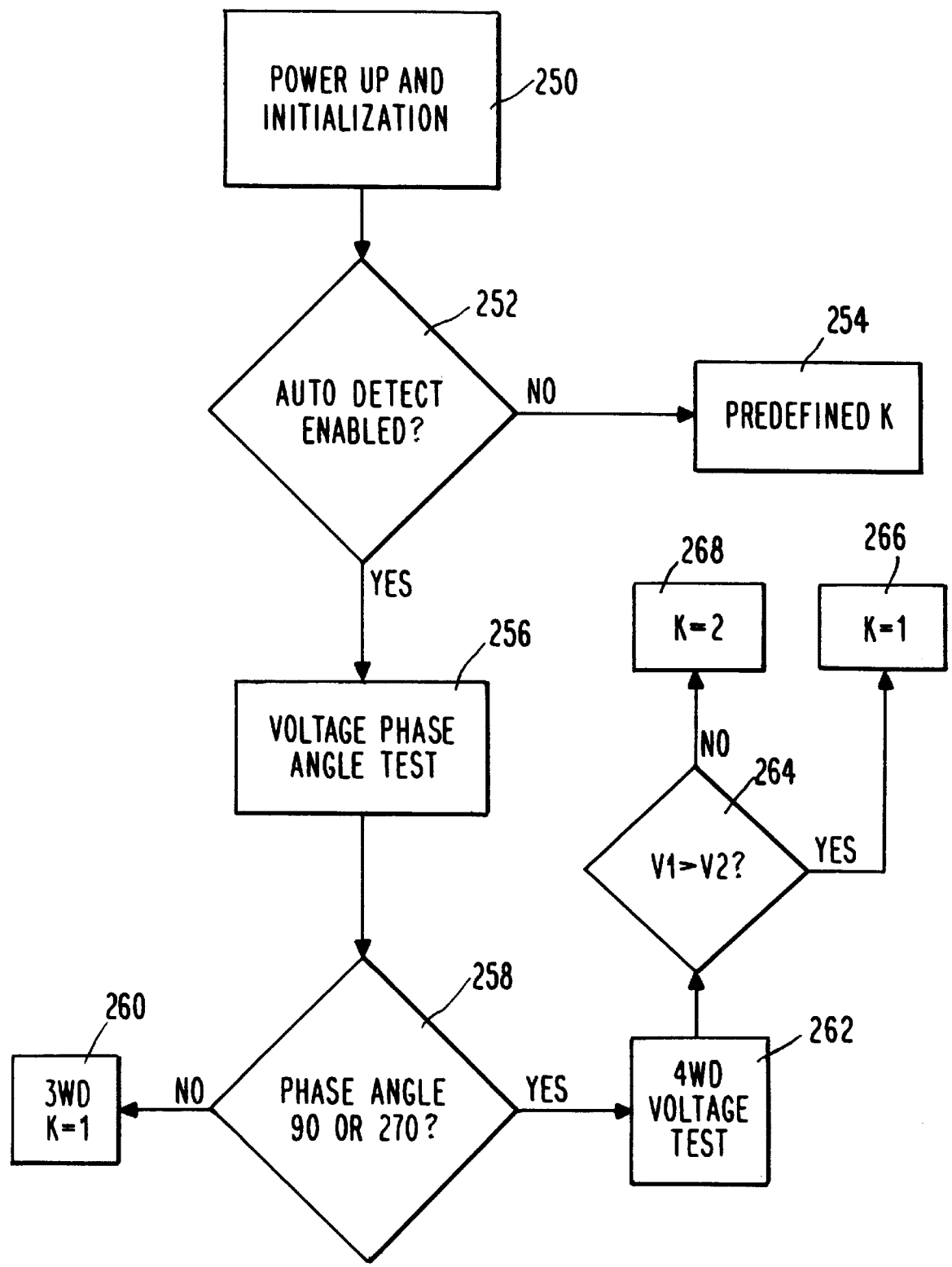
FIG. 12 shows a flow diagram of the steps carried out by the automatic service and isolation detection system in accordance with a preferred embodiment of the present invention.

FIG. 12 shows a flow diagram of the steps carried out by the automatic service and isolation detection system in accordance with a preferred embodiment of the present invention. As shown in the figure, the meter is powered up and initialized at step 250. Specifically, following power up the microcontroller downloads the appropriate data and programs stored in the EEPROM over the IIC bus to the meter IC RAM.

In a preferred embodiment of the invention, the automatic detection features of the system may be enabled or disabled in accordance with data stored in the EEPROM. If automatic detection is disabled, then the value of k must also be defined and stored in the EEPROM and downloaded to the meter IC RAM. Moreover, if automatic detection is not enabled, then the phase angle generator 206, service detector 204, and isolation detector 208 in FIG. 11 are likewise preferably disabled.

Returning to FIG. 12, the system software determines whether or not the automatic detection feature is enabled at step 252. If it is not enabled, then the system software fetches the predefined value for k at step 254, which is a 1 or a 2 based on the intended service type and whether or not external potential transformers are provided by the installation, and generates the power measurements accordingly.

If the automatic detection is enabled as determined at step 252, the service detector initiates a voltage phase angle test at step 256. If the phase angle between $V_1$ and $V_2$ is approximately 90 degrees or 270 degrees as determined at step 258, then the service is identified as a 4-wire delta service. Otherwise the service is identified as a 3-wire delta service and k is set to 1 at step 260.

When the identified service is a 4-wire delta, a voltage test is carried out by the isolation detector at step 262. If $V_1$ is greater than $V_2$, i.e., $V_1$=240 V and $V_2$=208 $V_1$ as determined at step 264 then external potential transformers are deemed to be present and k is set to 1 at step 266. If $V_1$ is less than $V_2$ at step 264, i.e., $V_1$=120 V and $V_2$-208 ,V then external potential transformers are deemed to be absent and k is set to 2 at step 268. The voltage test may be implemented in hardware or software as a voltage comparator.

It should be understood that the steps shown in FIG. 12 may be carried out prior to each power measurement; or alternatively may be carried out periodically, i.e. at predetermined times, or may be event driven.

While the invention has been described and illustrated with reference to specific embodiments, those skilled in the art will recognize that modification and variations may be made without departing from the principles of the invention as described hereinabove and set forth in the following claims.

We claim:

1. An automatic electronic meter for metering three-phase electrical energy including voltage sensors for sensing line voltages supplied to the meter and for providing an output of voltage signals related to the sensed line voltages, comprising:

service detection means for determining whether the meter is connected to a 3-wire delta service or a 4-wire delta service;

isolation detection means for determining whether or not the line voltages so sensed are isolated; and power measurement means operatively interfaced with the service detection means and the isolation detection means for generating power measurements based on the determinations made by the service detection means and the isolation detection means.

2. The meter of claim 1, wherein the meter further comprises:

phase angle measurement means interfaced with the service detection means for measuring the phase angle between two phases of the electrical energy.

3. The meter of claim 2, wherein the isolation detection means comprises:

voltage comparison means for comparing the phase voltage of each of said two phases and, based upon which of the two phase voltages is largest, determining whether the line voltages are isolated.

4. The meter of claim 1, wherein the meter generates phase voltage measurements based on the voltage signals and wherein the isolation detection means comprises:

a voltage comparison means for comparing the phase voltage measurements and based on the comparison determines whether the line voltages are isolated.

5. The meter of claim 1, wherein the meter further comprises current sensors for sensing line currents associated with the three phase electrical energy and wherein the power measurement means generates power measurements in accordance with the following formula:

$$kV_1I_1+V_2I_2$$

where $V_1$ is a voltage related to the voltage signal for at least a first phase of the electrical energy, $V_2$ is a voltage related to the voltage signal for a second phase of the electrical energy, $I_1$ is a current related at least in part to the first phase; $I_2$ is a current related to the second phase; and where k=1 for a 3-wire delta service and for a 4-wire delta service with external potential transformers and k=2 for a 4-wire delta service without external potential transformers.

6. The meter of claim 5, wherein the meter the power measurement means generates alternative power measurements in accordance with the following formulas:

$$\text{Apparent Power} = VA = kV_{1RMS}I_{1RMS} + V_{2RMS}I_{2RMS}$$

$$\text{Reactive Power} = \sqrt{(kV_{1RMS}I_{1RMS})^2 - (kV_1I_1)^2} + \sqrt{(V_{2RMS}I_{2RMS})^2 - (V_2I_2)^2}$$

where the RMS values of $V_1$, $I_1$, $V_2$ and $I_2$ are computed over a predetermined number of line cycles.

7. The meter of claim 1, wherein the determinations made by the service detection means and the isolation detection means are made programmably at one of a preselected set of times or prior to each power measurement.

8. The meter of claim 1, further comprising:

system enable means for programmably enabling the service detection means and the isolation detection means.

9. A automatic 2-element electronic energy meter for metering three-phase electrical energy having three voltage connections, comprising:

voltage sensing means for sensing at least two voltages associated with the electrical energy supplied to the meter and generating an output of voltage signals;

current sensing means for sensing at least two currents associated with the electrical energy supplied to the meter and generating an output of current signals;

a sampling means coupled to the voltage sensing means and current sensing means for sampling the voltage signals and the current signals to provide an output of sampled voltage signals and sampled current singles respectively;

a non-volatile memory having stored therein service type identification information specifying either of a preselected service type or automatic service type detection; and a processing means interfaced with the non-volatile memory to receive the service type identification information and coupled to the sampling means for generating power measurements depending upon the service type identification information.

10. The meter of claim 9, wherein the processing means automatically detects whether the service type is a 3-wire delta service or a 4-wire delta service when the service type identification information specifies automatic service type detection.

11. The meter of claim 10, wherein the processing means additionally detects whether or not the sensed voltages are isolated when the service type identification information specifies automatic service type detection and the service detected is the 4-wire delta service.

12. A method of automatic metering three phase electrical energy using a 2-element electronic energy meter with three voltage connections, comprising the steps of:

receiving an input of voltage signals relating to the three-phase electrical energy supplied to the meter;

processing the voltage signals to determine the voltage for a first voltage measurement ($V_1$) of the electrical energy referenced to a common potential point among the three phases ($V_N$), the voltage for a second voltage measurement ($V_2$) of the electrical energy referenced to $V_N$, and a phase angle between $V_1$ and $V_2$;

evaluating the phase angle to identify the service type as a 3-wire delta service or a 4-wire delta service;

comparing the voltages for $V_1$ and $V_2$ to determine whether or not the voltage signals are isolated, said determination defining a voltage isolation determination; and generating a power measurement based on the service type and voltage isolation determination.

13. The method of claim 12, further comprising the step of:

automatically invoking the comparing steps and the generating step.

14. The method of claim 12, wherein the service type is identified as a 4-wire delta service when the phase angle between $V_1$ and $V_2$ is either of about 90 degrees or about 270 degrees.

15. The method of claim 14, wherein the voltage signals are determined to be isolated when the voltage $V_1$ is greater than voltage $V_2$.

16. The method of claim 15, wherein the power measurement is generated in accordance with the following:

$$kV_1I_1+V_2I_2$$

where $I_1$ and $I_2$ are currents associated with respective first and second measurements of the electrical energy supplied to the meter and where k=1 for a 3-wire delta service and for a 4-wire delta service with isolated voltage signals and where k=2 for a 4-wire delta service with non-isolated voltage signals.

17. The method of claim 12, wherein the voltage signals are determined to be isolated when the voltage $V_1$ is greater than voltage $V_2$.

18. The method of claim 12, wherein the power measurement is generated in accordance with the following:

$$kV_1I_1+V_2I_2$$

where $I_1$ and $I_2$ are currents associated with respective first and second phases of the electrical energy supplied to the meter and where k=1 for a 3-wire delta service and for a 4-wire delta service and isolated voltage signals and where k=2 for a 4-wire delta service and non-isolated voltage signals.

19. The meter of claim 9, wherein the processing means automatically detects whether the service type is a 3-wire delta service, a 4-wire delta service with external potential transformers, or a 4-wire delta service without external potential transformers when the service type identification information specifies automatic service type identification.

* * * * *

UNITED STATES PATENT AND TRADEMARK OFFICE
CERTIFICATE OF CORRECTION

PATENT NO.   : 6,141,626
DATED        : October 31, 2000
INVENTOR(S)  : Scott T. Holdsclaw; Rodney C. Hemminger Page 1 of 1

It is certified that error appears in the above-identified patent and that said Letters Patent is hereby corrected as shown below:

Column 2,
Equation (3), there is an error in the last square root, and the entire equation should read as follows:

$$ReactivePower = VARs = \sqrt{VA_1^2 - Watt_1^2} + \sqrt{VA_2^2 - Watt_2^2}$$

$$= \sqrt{(V_{1RMS}I_{1RMS})^2 - (V_1 I_1)^2} + \sqrt{V_{2RMS}I_{2RMS}^2 - (V_2 I_2)^2}$$

Column 3,
Lines 3, "$I_2 = I_A$" should read -- $I_1 = I_A$ --

Column 7,
Equation (9) there is an error in the last square root, and the entire equation should read as follows:

$$ReactivePower = VARs = \sqrt{VA_1^2 - Watt_1^2} + \sqrt{VA_2^2 - Watt_2^2}$$

$$= \sqrt{(kV_{1RMS}I_{1RMS})^2 - (kV_1 I_1)^2} + \sqrt{V_{2RMS}I_{2RMS}^2 - V_2 I_2)^2}$$

Column 11,
Line 30, "$V_2 = 208\ V_1$" should read: -- $V_2 = 208\ V$ --
Line 33, "$V_2 - 208, V$" should read: -- $V_2 - 208\ V$ --

Column 12,
Lines 32-38, claim 6, there are several errors in the equations, which should read as follows:

$$ReactivePower = \sqrt{(kV_{1RMS}I_{1RMS})^2 - (kV_1 I_1)^2} + \sqrt{V_{2RMS}I_{2RMS}^2 - (V_2 I_2)^2}$$

Signed and Sealed this

Twenty-seventh Day of November, 2001

Attest:

*Attesting Officer*

NICHOLAS P. GODICI
*Acting Director of the United States Patent and Trademark Office*